US008065653B1

(12) United States Patent  (10) Patent No.: US 8,065,653 B1
Best et al.  (45) Date of Patent: Nov. 22, 2011

(54) CONFIGURATION OF PROGRAMMABLE IC DESIGN ELEMENTS

(75) Inventors: Andrew Best, Brier, WA (US); Kenneth Ogami, Bothell, WA (US); Marat Zhaksilikov, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 399 days.

(21) Appl. No.: 12/058,569

(22) Filed: Mar. 28, 2008

Related U.S. Application Data

(63) Continuation-in-part of application No. 12/004,833, filed on Dec. 21, 2007.

(60) Provisional application No. 60/926,096, filed on Apr. 25, 2007.

(51) Int. Cl.
*G06F 17/50* (2006.01)
(52) U.S. Cl. ............... 716/139; 716/116; 716/128
(58) Field of Classification Search ............ 716/11, 716/16, 17, 116, 128, 139
See application file for complete search history.

(56) References Cited

U.S. PATENT DOCUMENTS

| | | |
|---|---|---|
| 5,276,739 A | 1/1994 | Krokstad et al. |
| 5,408,235 A | 4/1995 | Doyle et al. |
| 5,625,583 A | 4/1997 | Hyatt |
| 5,652,893 A | 7/1997 | Ben-Meir et al. |
| 5,661,433 A | 8/1997 | LaRosa et al. |
| 5,728,933 A | 3/1998 | Schultz et al. |
| 5,801,958 A | 9/1998 | Dangelo et al. |
| 5,818,736 A | 10/1998 | Leibold |
| 6,035,320 A | 3/2000 | Kiriaki et al. |
| 6,167,364 A | 12/2000 | Stellenberg et al. |
| 6,216,254 B1 | 4/2001 | Pesce et al. |
| 6,321,369 B1 | 11/2001 | Heile et al. |
| 6,401,230 B1 | 6/2002 | Ahanessians et al. |
| 6,421,817 B1 | 7/2002 | Mohan et al. |
| 6,425,109 B1 | 7/2002 | Choukalos et al. |
| 6,460,172 B1 | 10/2002 | Insenser Farre et al. |
| 6,496,969 B2 | 12/2002 | Feng et al. |
| 6,546,297 B1 | 4/2003 | Gaston et al. |
| 6,556,044 B2 | 4/2003 | Langhammer et al. |
| 6,578,174 B2 | 6/2003 | Zizzo |
| 6,634,009 B1 | 10/2003 | Molson et al. |
| 6,636,169 B1 | 10/2003 | Distinti et al. |
| 6,671,869 B2 * | 12/2003 | Davidson et al. ............... 716/17 |
| 6,703,961 B2 | 3/2004 | Mueck et al. |
| 6,715,132 B1 | 3/2004 | Bartz et al. |
| 6,725,441 B1 | 4/2004 | Keller et al. |
| 6,750,876 B1 | 6/2004 | Atsatt et al. |
| 6,961,686 B2 | 11/2005 | Kodosky et al. |
| 7,003,732 B1 | 2/2006 | Zhaksilikov |
| 7,082,584 B2 | 7/2006 | Lahner et al. |
| 7,086,014 B1 | 8/2006 | Bartz et al. |
| 7,100,133 B1 | 8/2006 | Meiyappan et al. |

(Continued)

OTHER PUBLICATIONS

USPTO Non-Final Rejection for U.S. Appl. No. 12/058,534 dated Jan. 11, 2011; 17 pages.

(Continued)

*Primary Examiner* — Sun J Lin

(57) ABSTRACT

Techniques for configuring a programmable integrated circuit (IC) include determining design elements of the programmable integrated circuit that need to be configured prior to run-time operation of the programmable IC. A user interface provides for configuring one or more parameters for each of the determined design elements that need to be configured. Thereafter, the design elements are configured based on the one or more parameter values specified through the user interface.

17 Claims, 4 Drawing Sheets

U.S. PATENT DOCUMENTS

| | | | |
|---|---|---|---|
| 7,100,139 B1 * | 8/2006 | Anderson et al. | 716/11 |
| 7,113,090 B1 | 9/2006 | Saylor et al. | |
| 7,143,360 B1 | 11/2006 | Ogami et al. | |
| 7,299,307 B1 * | 11/2007 | Early et al. | 710/33 |
| 7,337,407 B1 | 2/2008 | Ogami et al. | |
| 7,392,011 B1 | 6/2008 | Jacomb-Hood | |
| 7,437,692 B2 | 10/2008 | Oberlaender | |
| 7,461,274 B2 | 12/2008 | Merkin | |
| 7,809,545 B2 | 10/2010 | Ciofi et al. | |
| 2003/0086300 A1 | 5/2003 | Noyes et al. | |
| 2008/0086668 A1 | 4/2008 | Jefferson et al. | |
| 2008/0178143 A1 | 7/2008 | Dougan et al. | |
| 2010/0023865 A1 | 1/2010 | Fulker et al. | |

OTHER PUBLICATIONS

USPTO Non-Final Rejection for U.S. Appl. No. 12/004,833 dated Dec. 21, 2010; 8 pages.

USPTO Requirement Restriction for U.S. Appl. No. 12/004,833 dated Sep. 22, 2010; 6 pages.

Application No. 12/058,586; "System and Method for Monitoring a Target Device," Kenneth Ogami et al. filed on Mar. 28, 2008; 56 pages.

USPTO Notice of Allowance for U.S. Appl. No. 10/118,682 dated Apr. 3, 2006; 4 pages.

USPTO Final Rejection for U.S. Appl. No. 10/118,682 dated Oct. 12, 2005; 11 pages.

USPTO Non-Final Rejection for U.S. Appl. No. 10/118,682 dated Jun. 16, 2005; 12 pages.

USPTO Requirement Restriction for U.S. Appl. No. 10/118,682 dated Apr. 28, 2005; 4 pages.

USPTO Non-Final Rejection for U.S. Appl. No. 10/118,682 dated Jan. 12, 2005; 11 pages.

USPTO Non-Final Rejection for U.S. Appl. No. 10/118,682 dated Sep. 24, 2004; 8 pages.

USPTO Final Rejection for U.S. Appl. No. 10/118,682 dated May 3, 2004; 8 pages.

USPTO Non-Final Rejection for U.S. Appl. No. 10/118,682 dated Feb. 25, 2004; 9 pages.

USPTO Non-Final Rejection for U.S. Appl. No. 10/118,682 dated Nov. 3, 2003; 8 pages.

USPTO Notice of Allowance for U.S. Appl. No. 10/329,162 dated Jul. 5, 2007; 7 pages.

USPTO Non-Final Rejection for U.S. Appl. No. 10/329,162 dated Jan. 29, 2007; 10 pages.

USPTO Final Rejection for U.S. Appl. No. 10/329,162 dated Aug. 25, 2006; 12 pages.

USPTO Non-Final Rejection for U.S. Appl. No. 10/329,162 dated Mar. 10, 2006; 9 pages.

USPTO Final Rejection for U.S. Appl. No. 10/329,162 dated Sep. 21, 2005; 12 pages.

USPTO Non-Final Rejection for U.S. Appl. No. 10/329,162 dated Apr. 21, 2005; 10 pages.

USPTO Advisory Action for U.S. Appl. No. 10/329,162 dated Mar. 29, 2005; 2 pages.

USPTO Final Rejection for U.S. Appl. No. 10/329,162 dated Dec. 15, 2004; 10 pages.

USPTO Non-Final Rejection for U.S. Appl. No. 10/329,162 dated Aug. 2, 2004; 8 pages.

USPTO Non-Final Rejection for U.S. Appl. No. 12/058,586 dated May 24, 2011; 13 pages.

USPTO Final Rejection for U.S. Appl. No. 12/058,534 dated Jun. 2, 2011; 15 pages.

USPTO Final Rejection for U.S. Appl. No. 12/004,833 dated May 25, 2011; 11 pages.

USPTO Notice of Allowance for U.S. Appl. No. 12/057,149 dated Mar. 17, 2011; 8 pages.

USPTO Notice of Allowance for U.S. Appl. No. 12/057,149 dated Nov. 30, 2010; 7 pages.

"PSoC Designer: Integrated Development Environment User Guide"; Jul. 17, 2001; Cypress MicroSystems; Revision 1.11; 109 pages.

Seguine et al.; "Layout Guidelines for PSoC CapSense"; Oct. 31, 2005; Cypress Perform; 15 pages.

* cited by examiner

CONFIGURATION OF PROGRAMMABLE IC DESIGN ELEMENTS

CROSS-REFERENCE TO RELATED APPLICATIONS

The present application claims the benefit of U.S. Provisional Patent Application No. 60/926,096 filed Apr. 25, 2007, which is incorporated herein by reference. The present application is also a continuation-in-part of U.S. patent application Ser. No. 12/004,833 filed Dec. 21, 2007, which is incorporated herein by reference.

BACKGROUND OF THE INVENTION

Electronic systems and circuits have made a significant contribution towards the advancement of modern society and are utilized in a number of applications to achieve advantageous results. Electronic systems and circuits often include integrated circuits (ICs) fabricated on a single substrate that provide a variety of advantages over discrete component circuits. However, traditional design and manufacturing approaches for integrated circuits are often complex and consume significant resources.

In the past each given IC design was static. More recently, the semiconductor industry has developed a wide range of programmable integrated circuits. The programmable integrated circuits can be customized by system designers to perform a wide variety of tasks. Such configurable integrated circuits include field programmable gate arrays (FPGAs), complex programmable logic devices (CPLDs), field programmable analog arrays (FPAAs), and the like.

The configurable design elements of ICs may require configuration of operating parameters prior to run-time operation. Specifying operating parameters generally requires a time consuming and error prone process. For example, the configuration of programmable ICs typically involves complex interactions with complicated command structures and syntaxes that are not readily comprehensible or user friendly. Accordingly, there is a continued need for improved design techniques for use with programmable ICs and systems that include such ICs.

SUMMARY OF THE INVENTION

Embodiments of the present technology are directed toward techniques for configuring design elements of programmable integrated circuits (ICs). In one embodiment, a host computing device coupled to a programmable IC is adapted for configuring design elements utilizing a graphical interface. The graphical interface enables a user to specify configuration parameters for design elements that need to be configured prior to operation of the IC.

In another embodiment, a method of configuring a target system includes determining a design element of a programmable IC to be configured. A graphical user interface for configuring one or more parameters of the design element is generated. The target system may then be configured based on the one or more parameter values specified through the graphical user interface.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Embodiments of the present technology generally relate to the field of integrated circuits (ICs). More specifically, embodiments pertain to systems and method for configuring design elements in a programmable IC. The techniques include a graphical user interface (GUI) based tool that allows a developer to configure design elements of the programmable integrated circuit.

Figure 1:
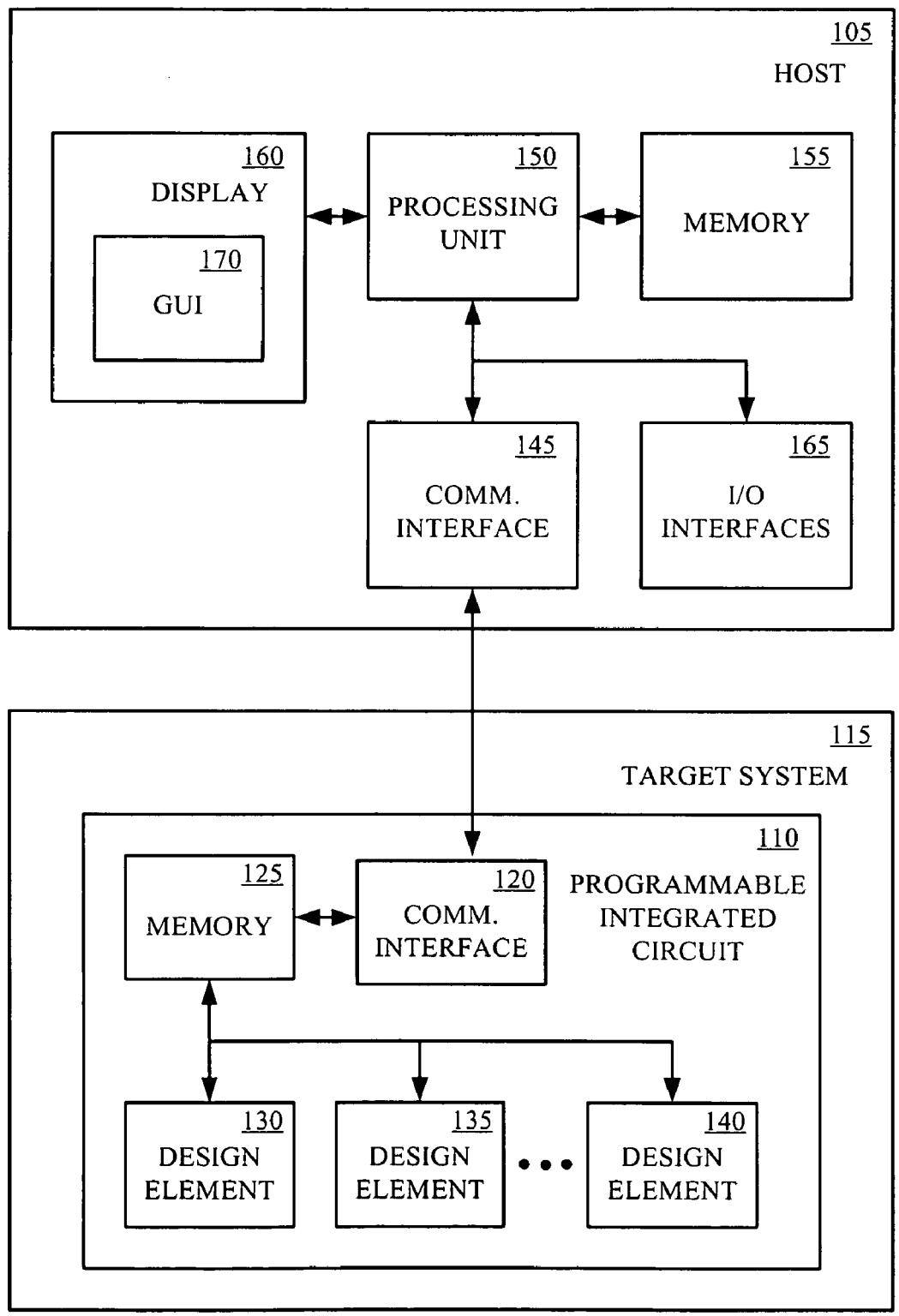
FIG. 1 shows a block diagram of an exemplary system for configuring a programmable integrated circuit (IC), in accordance with one embodiment of the present technology.

FIG. 1 shows an exemplary system for configuring a programmable IC, in accordance with one embodiment of the present technology. The system includes a host computing device 105 coupled to a programmable IC 110, or a target system 115 that includes a programmable IC 110. The programmable IC 110 includes one or more communication interfaces 120, memory 125, and a plurality of design elements 130-140. The design elements may be input devices, environmental measuring devices, transfer functions, output devices and/or the like. For example, the design elements may be buttons, sliders, light emitting diodes, device temperature sensors, capacitive sensors, alarms, fans, transfer function, microcontroller and the like, or diver circuits for such elements in the target system 115. The capacitive sensor elements may include capacitive sensors for buttons, linear and radial sliders, touchpads, touchscreens and the like. The light emitting elements may include light emitting diodes (LEDs), seven segmented LEDs, triads of high brightness colored LEDs (e.g., red, blue and green LEDs to produce a spectrum of colors), LCD displays and the like. The above described design elements are exemplary and it is appreciated that the design elements 130-140 may include any number of other similar elements that may be configured.

An exemplary family of programmable integrated circuits is the PSoC® programmable system on a chip, commercially available from Cypress Semiconductor of San Jose, Calif. One set of products, PSoC mixed signal arrays, are programmable systems-on-chips (SOCs) that integrate a microcontroller and the analog and digital components that typically surround it in an embedded system. A single PSoC device can integrate 100 or more peripheral functions with a microcontroller, saving customers design time, board space, power consumption and bill of materials costs.

The design elements 130-140 are high level functionality of lower level user modules configured in a particular manner. The lower level modules may include one or more analog function blocks and/or one or more digital function blocks. The analog and digital function blocks may be combined in a variety of configurations to accomplish a variety of functions (e.g., design elements). Different combinations of blocks, producing different functions, may exist at different times within the same IC and/or target system. For example, a set of function blocks configured to perform the functions of analog-to-digital conversion may sample an input signal. After processing the input signal in the digital domain, some or all of those same blocks, and perhaps in conjunction with other blocks, may be recombined in a different configuration to perform the function of digital-to-analog conversion to produce an output signal.

The host computing device 105 may be implemented on a variety of computing platforms, such as a personal computer (PC), workstation, server, distributed computing system, or the like. The host computing device 105 includes one or more communication interfaces 145, a processing unit 150, memory 155, a display 160, and one or more other input/output (I/O) interfaces 165. The I/O interfaces 165 may include a keyboard, a pointing device (e.g., mouse), speaker, printer and/or the like. The memory 155 may include one or more computing device readable media, such as non-volatile read-only memory (ROM), flash memory, volatile random access memory (RAM), optical storage (e.g., CD/DVD disk and drive), magnetic storage (e.g., hard disk drive (HDD)), and/or the like. The memory stores computing device executable commands and data (e.g., one or more software applications). The processing unit 150 implements one or more functions of the host 105 by executing one or more software applications stored in the memory. A portion of the computing device readable data and commands stored in the memory 144, when executed by the processor 150, implement a design tool for configuring the integrated circuit 110 and/or target system 115. The tool may also include simulation and monitoring tools. The tool generates a graphical user interface (GUI) 170 that is presented on the display 160 of the host 105. A user may select and configure various design element of the IC 110 through the GUI using the host keyboard, mouse and/or the like.

At least one communication interface 145 of the host computing device 105 and at least one communication interface 120 of the programmable integrated circuit 110 provides for communication between the host 105 and the integrated circuit 110. The communication interfaces 145, 120 may be any type of serial or parallel communication interfaces, such as Inter-Integrated Circuit (I2C) ports, Universal Serial Bus ports, Serial Peripheral Interface Bus (SPI) ports, Universal Asynchronous Receiver/Transmitter (UART) ports, Ethernet ports, and/or the like. If the communication ports of the host 105 and integrated circuit 110 are not the same, one or the other of the communication interfaces may also implement a bridging function to convert from one communication interface to another.

The memory 125 in the programmable IC 110 is computing device readable media for storing computing device readable commands and data. The memory includes non-volatile computing device readable media such as programmable read-only memory (PROM), electrically erasable PROM (EEPROM), flash memory and/or the like. The memory 125 may also include volatile computing device readable media such as random access memory (RAM) or the like. The memory 125 is used to store a configuration file that controls the functional coupling and configuration of the plurality of design elements 130-140 of the IC 110. The IC 110 may also read a portion, or all, of the configuration file from an externally coupled memory through a communication interface. The design tool on the host computing device 105 is utilized to create and modify the configuration file of the IC 110.

Figure 2:
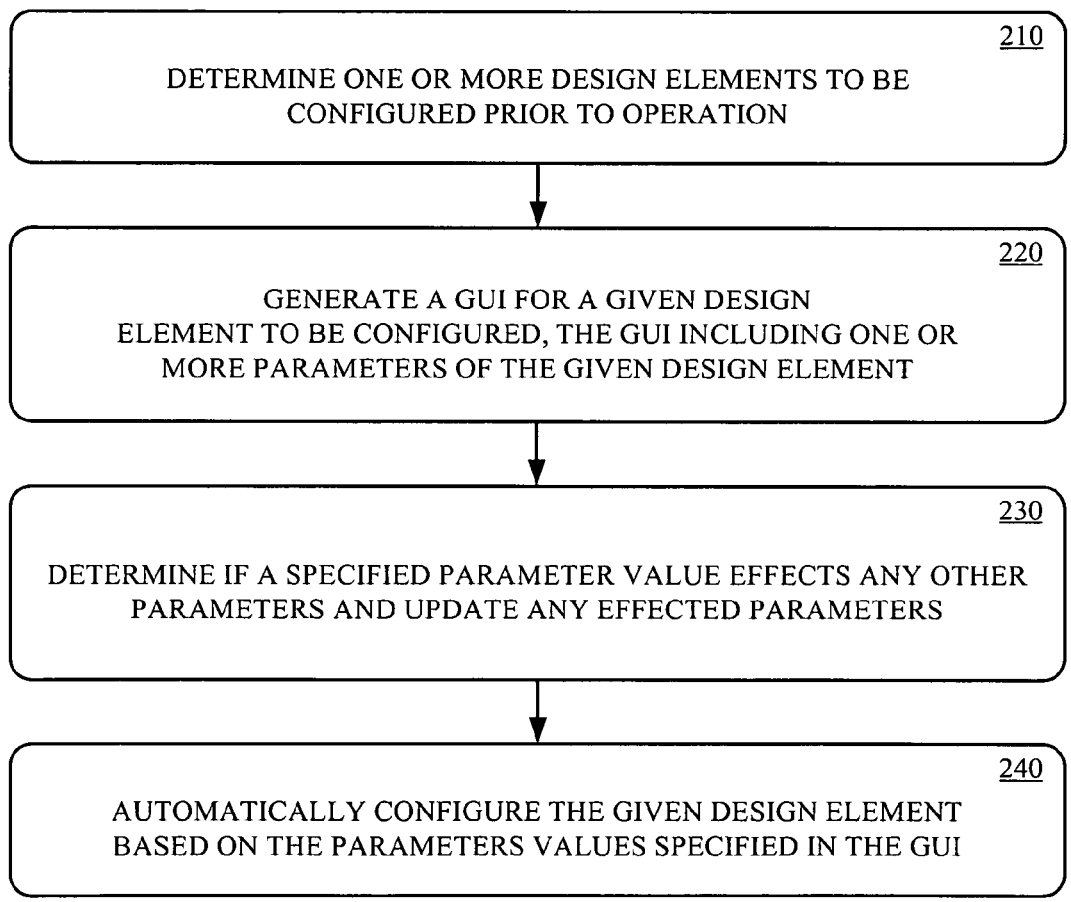
FIG. 2 shows a flow diagram of a method of configuring a programmable IC.

Operation of embodiments of the present technology will be further described with reference to FIG. 2, which shows a method of configuring a programmable IC. At 210, a design tool of the host computing device 105 determines if one or more selected design elements 130-140 need to be configured prior to operation of the programmable IC 110.

At 220, if a given design element needs to be configured, a design element specific GUI 170 is generated by the design tool. The GUI 170 helps the user select the proper parameter values for design elements. This may include taking the user through a set of questions, the responses to which then indicate which follow-on questions are asked based on the requirements of the design elements. The design element specific GUI 170 includes one or more editable input mechanisms for specifying parameters of the given design element. The user may specify values for the one or more parameters from the GUI. The tool may also determine if a specified value of a given parameter impacts another parameter of a design element, at 230. If one or more design element parameters change as a result of a change to a given parameter, the GUI displays the new value of the given parameter that changed along with changes to the other parameters.

At 240, the tool automatically configures each given design element based on the property values specified in the corresponding design element specific GUI of the design tool. The automatic configuration may include generating a configuration file that controls the functional coupling and configuration of the given design elements and loading of the configuration file into the memory 125 of the configurable IC 110 and/or target system 115.

Figure 3:
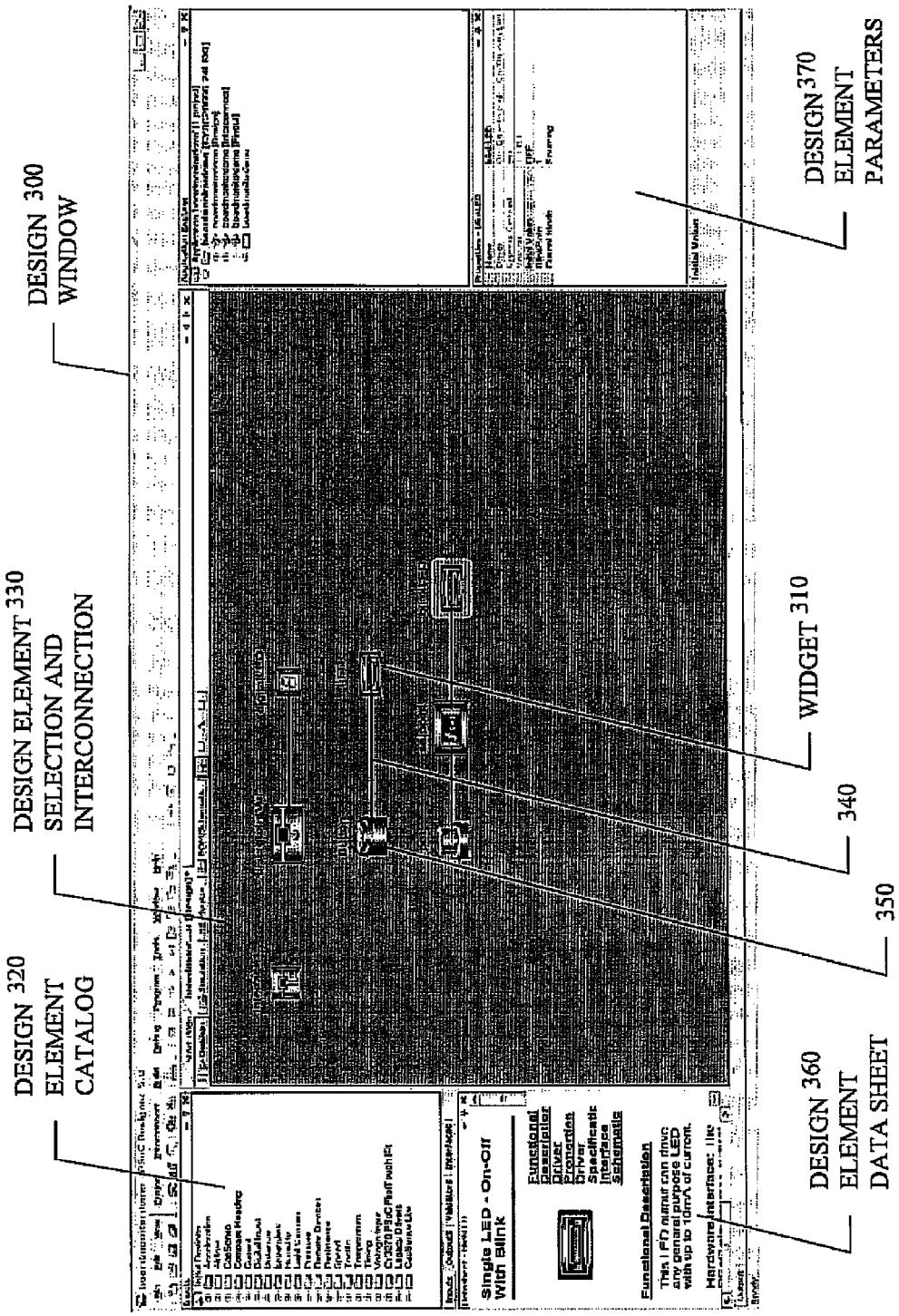
FIG. 3 shows an exemplary graphical user interface (GUI), in accordance with one embodiment of the present technology.

Embodiments of the present technology will be further illustrated with reference to FIGS. 3-4, which show an exemplary GUI, in accordance with one embodiment of the present technology. The GUI is adapted to facilitate customization of programmable ICs using symbolic indications of corresponding design elements. In particular, users are able to create a circuit design by dragging and dropping high level "widget" icons 310 representing design elements within a design window 300. In one implementation, the user may select a design element from a design element catalog portion 320 of the design window. In selecting a design element, the user drags a widget icon 310 from the design element catalog 320 to a design element selection and interconnection portion 330 of the design window. The user may also connect the design elements by linking 340 corresponding widget icons 310, 350 in the design element selection and interconnection portion 330 of the design window 300.

The widget icons 310, 350 may include a graphical representation of the corresponding design element and an information group. The information group of a given widget may display status, value indicators, function transfer indicators, present value indicators, setpoint indicators and/or the like.

In addition, items in the GUI may be displayed with different visual attributes. For example, color, highlighting or the like may be used to organize, associate or differentiate one or more items from one or more other items in the GUI.

The design window may also include a design element data sheet portion 360 for displaying technical data concerning corresponding design elements, a design element parameter portion 370 for displaying parameters and parameter values for corresponding design elements, and or the like.

Figure 4:
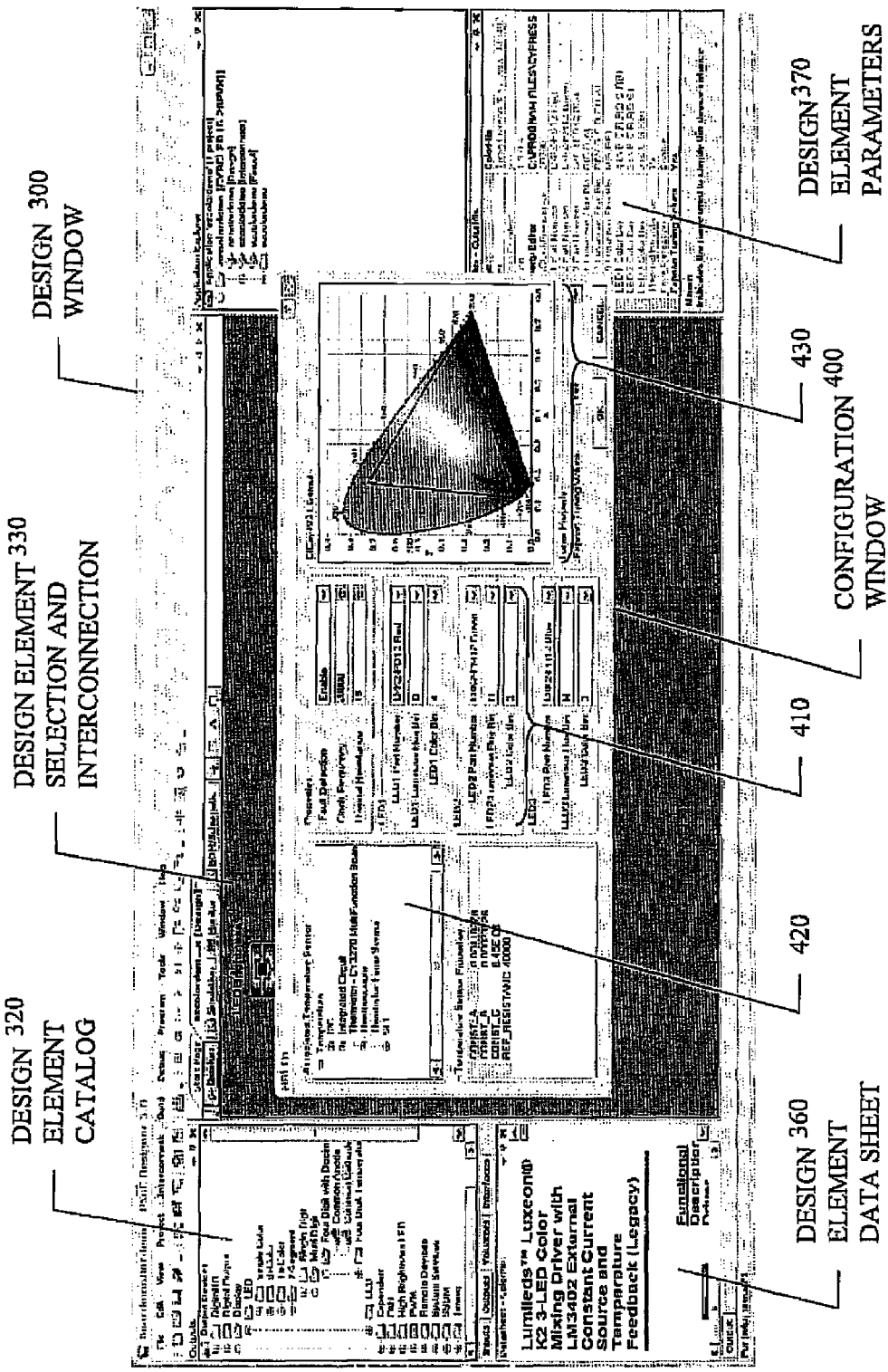
FIG. 4 shows an exemplary GUI, in accordance with one embodiment of the present technology.

If a widget 310 of a design element selected from the design element catalog 320 and placed in the design element selection and interconnect portion 330 of the design window 300 needs to be configured, the design tool presents a design element specific configuration window, as illustrated in FIG. 4. The design element specific configuration window 400 displays one or more parameters of a given design element that needs to be configured prior to run-time operation of the IC and/or target system. The configuration window 400 helps the user select the proper parameter values for design elements. This may include taking the user through a set of questions, the responses to which then indicate which follow-on questions are asked based on the configuration requirements of the design elements. In particular, the design configuration window 400 includes selectable and/or editable alphanumeric fields 410, 420 and/or selectable and/or editable graphical fields 430 for inputting one or more configuration parameter values. Parameter values may be specified by user actions, such as typing a value in an editable alphanumeric field 410, dragging an object in an editable graphical display field 420, and/or the like.

The tool may also determine if the value of a given design element parameter is affected by a change in another parameter of the design element. If the given design element parameter changes as a result of the change to the other parameter, the GUI displays the new value of the given parameters that changed.

As illustrated, the GUI includes a configuration window 400 for a triad high brightness LED specific driver. Such a design element requires custom configuration before it can be utilized. For instance, a circuit driver for the triad high brightness LED needs to be configured based on: 1) the color temperature of the LEDs used according to each manufacturer; 2) the temperature sensor used in the IC; and 3) the brightness of the LEDs selected. The configuration window 400 enables a user to specify a variety of parameters for configuring a driver circuit for operating the triad high brightness LED. A user may type a value of a BIN parameter in an appropriate editable alphanumeric field 410 of the configuration window 400. The user may also select a temperature sensor for operation of the high brightness LED by highlighting a given sensor in an editable alphanumeric field 420. In addition, the user may drag a vertex in a graphical representation of a color spectrum to specify a desired color output (e.g., set the chomaticity of the device). Furthermore, it is appreciated that the temperature and chromaticity for LEDs are related. Therefore, the design element specific configuration window 410 may show the effect of a specified temperature parameter 420 on the chromaticity of the device 430. Typically, the designer of the design element would provide the design element specific GUI for its custom configuration.

The specified parameter values for design elements associated with the high level design elements are then automatically translated and utilized to create lower level user module information which is converted to a configuration file. In particular, the parameter values for design elements are mapped to registers of the programmable IC and/or target device that control the execution of the programmable IC during run-time operation. Parameter values can also be used in generated source code to adjust the behavior of algorithms related to control of the design element by the target device.

Accordingly, users are able to design systems using programmable ICs without manually entering traditional code or reading data sheets. Embodiments generate a GUI that allows a developer to configure design elements of the programmable IC. The GUI advantageously presents design element specific parameters for each design element that needs to be configured prior to run-time. In addition, the GUI advantageously illustrates the effect of changes to one parameter on other related parameters. Thus, the GUI provides a user friendly, intuitive and friendly technique for configuring the design elements of programmable ICs and systems including such ICs.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the Claims appended hereto and their equivalents.

What is claimed is:

1. A system comprising:
a programmable integrated circuit including a plurality of design elements; and
a host computing device to configure the design elements utilizing a design element specific graphical interface to provide specification of configuration parameters of the design elements, the design element specific graphical interface to update a given parameter if a value of the given parameter is affected by a value specified for another parameter.

2. The system of claim 1, wherein the design element specific graphical interface presents a selectable or editable graphical field for specification of at least one of the configuration parameters.

3. The system of claim 1, wherein the design element specific graphical interface presents a selectable or editable alphanumeric field for specification of at least one of the configuration parameters.

4. The system of claim 1, wherein the design element specific graphical interface presents a selectable or editable graphical field and a selectable or editable alphanumeric field for specification of at least one of the configuration parameters.

5. The system of claim 1, wherein each design element comprises one or more analog function blocks, one or more digital function blocks, or one or more digital and one or more analog functional blocks.

6. A method of configuring a programmable integrated circuit using a computing device, the method comprising:
determining a design element of the programmable integrated circuit to be configured prior to run-time operation of the programmable integrated circuit;
generating a graphical user interface for configuring one or more parameters of the determined design element; and
using at least one processor of the computing device,
configuring the determined design element based on at least one parameter value specified through the graphical user interface, and
updating the one or more parameters through the graphical user interface based on the specified at least one parameter value affecting at least one other parameter value.

7. The method according to claim 6, wherein the generating the graphical user interface comprises:

presenting a first display window including a representation of the determined design element; and presenting a second display window including one or more editable input mechanisms for specifying the at least one parameter value.

8. The method according to claim 7, wherein the representation of the determined design element includes a symbolic representation.

9. The method according to claim 7, wherein the second display window is specific to the determined design element to be configured.

10. The method according to claim 7, wherein the one or more editable input mechanisms includes one or more selectable or editable alphanumeric fields.

11. The method according to claim 7, wherein the one or more editable input mechanisms include one or more selectable or editable graphical fields.

12. The method according to claim 6, wherein the configuring the given design element comprises:

responsive to specification of the at least one parameter value, generating a configuration file including the specified at least one parameter value of the design element; and loading the configuration file into the programmable integrated circuit.

13. One or more computing device readable media including computing-device-executable commands and data which, when executed by a processing unit of a computing device, cause the computing device to implement a method of configuring a target system comprising:

determining a design element of a programmable integrated circuit in the target system to be configured;

generating a graphical user interface for configuring one or more parameters of the determined design element; and configuring the target system based on a value of the one parameter or values of the more parameters specified through the graphical user interface, the generating the graphical user interface comprising, presenting a design window including a representation of the determined design element, and presenting a configuration window including the one or more parameters of the determined design element in an editable format.

14. The method according to claim 13, wherein the one or more parameters displayed in the configuration window are specific to the determined design element to be configured.

15. The method according to claim 13, wherein the editable format includes a selectable or editable alphanumeric format.

16. The method according to claim 13, wherein the editable format include a selectable or editable graphical format.

17. The method according to claim 13, wherein the editable format includes a selectable or editable alphanumeric format and a selectable or editable graphical format.

* * * * *